United States Patent
Miyake et al.

(10) Patent No.: US 9,814,146 B2
(45) Date of Patent: Nov. 7, 2017

(54) DRIVE APPARATUS

(71) Applicant: Mitsubishi Electric Corporation, Tokyo (JP)

(72) Inventors: Takanori Miyake, Tokyo (JP); Takashi Nakahira, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/906,678

(22) PCT Filed: Aug. 5, 2014

(86) PCT No.: PCT/JP2014/004078
§ 371 (c)(1),
(2) Date: Jan. 21, 2016

(87) PCT Pub. No.: WO2015/025488
PCT Pub. Date: Feb. 26, 2015

(65) Prior Publication Data
US 2016/0174392 A1 Jun. 16, 2016

(30) Foreign Application Priority Data
Aug. 23, 2013 (JP) .................. 2013-173221

(51) Int. Cl.
*H05K 5/00* (2006.01)
*B60L 11/18* (2006.01)
(Continued)

(52) U.S. Cl.
CPC ........ *H05K 5/0021* (2013.01); *B60L 11/1822* (2013.01); *B60L 11/1853* (2013.01);
(Continued)

(58) Field of Classification Search
CPC ........ H05K 5/0021; H02P 29/40; B23Q 17/00
(Continued)

(56) References Cited

U.S. PATENT DOCUMENTS 3,093,731 A * 6/1963 Karplus .................. G06G 7/46
703/3
4,929,876 A * 5/1990 Kato ....................... B60S 1/482
318/444
(Continued)

FOREIGN PATENT DOCUMENTS

JP  3-30339 U  3/1991
JP  3-71530 U  7/1991
(Continued)

OTHER PUBLICATIONS

International Search Report of PCT/JP2014/004078 dated Sep. 2, 2014.
(Continued)

*Primary Examiner* — Bentsu Ro
(74) *Attorney, Agent, or Firm* — Sughrue Mion, PLLC; Richard C. Turner

(57) ABSTRACT

Plug having common specifications are arranged on the side surfaces of each of the devices of different types included in the drive apparatus that controls an electric motor, and the plugs are positioned such that the side surfaces of the devices are in close contact with each other by connecting the plugs and the devices of different types are integrated.

12 Claims, 7 Drawing Sheets

(51) Int. Cl.
| | |
|---|---|
| *H01H 73/20* | (2006.01) |
| *H02P 29/40* | (2016.01) |
| *H01H 71/02* | (2006.01) |
| *H01H 71/08* | (2006.01) |
| *H01H 50/04* | (2006.01) |
| *H02B 1/052* | (2006.01) |
| *H02P 27/06* | (2006.01) |
| *H02M 7/00* | (2006.01) |

(52) U.S. Cl.
CPC ............ *H01H 73/20* (2013.01); *H02P 29/40* (2016.02); *H01H 50/047* (2013.01); *H01H 71/0271* (2013.01); *H01H 71/082* (2013.01); *H02B 1/052* (2013.01); *H02M 7/003* (2013.01); *H02P 27/06* (2013.01); *Y02T 10/642* (2013.01); *Y02T 10/705* (2013.01); *Y02T 10/7005* (2013.01); *Y02T 10/7072* (2013.01); *Y02T 90/124* (2013.01); *Y02T 90/127* (2013.01); *Y02T 90/14* (2013.01)

(58) Field of Classification Search
USPC .......................................................... 318/17
See application file for complete search history.

(56) References Cited

U.S. PATENT DOCUMENTS

| | | | | |
|---|---|---|---|---|
| 4,996,477 A | * | 2/1991 | Keeler ................... | G01R 31/34 318/490 |
| 5,493,194 A | * | 2/1996 | Damiano ............. | G05B 19/414 307/71 |
| 5,739,648 A | * | 4/1998 | Ellis ................... | G05B 19/4142 318/103 |
| 5,834,909 A | * | 11/1998 | Marmonier .............. | H01H 3/26 200/329 |
| 5,877,913 A | * | 3/1999 | Shitara ................... | G11B 19/28 318/85 |
| 6,011,372 A | * | 1/2000 | Popovich, Jr. ........ | G05B 19/042 318/560 |
| 6,554,075 B2 | * | 4/2003 | Fikes .................... | E21B 15/003 166/379 |
| 6,650,808 B1 | * | 11/2003 | Vujcic ................ | H04B 10/1143 385/134 |
| 6,704,815 B1 | | 3/2004 | Morikawa et al. | |
| 6,717,515 B1 | | 4/2004 | Osako et al. | |
| 7,116,069 B1 | * | 10/2006 | Holterman ......... | G05B 19/0428 318/400.21 |
| 2002/0185362 A1 | | 12/2002 | Okuyama et al. | |
| 2004/0047137 A1 | | 3/2004 | Quero et al. | |
| 2005/0077069 A1 | | 4/2005 | Quero et al. | |
| 2005/0183875 A1 | | 8/2005 | Quero et al. | |

FOREIGN PATENT DOCUMENTS

| | | |
|---|---|---|
| JP | 9-288953 A | 11/1997 |
| JP | 2000-100297 A | 4/2000 |
| JP | 2001-52777 A | 2/2001 |
| JP | 2001-222788 A | 8/2001 |
| JP | 2002-100436 A | 4/2002 |
| JP | 2002-365028 A | 12/2002 |
| JP | 2004-012344 A | 1/2004 |
| JP | 2007-174494 A | 7/2007 |
| JP | 2009-514488 A | 4/2009 |
| KR | 10-2013-0084136 A | 7/2013 |
| WO | 2015/025489 A1 | 2/2015 |

OTHER PUBLICATIONS

Communication dated Jan. 4, 2017 issued by the Japanese patent Office in counterpart application No. 2015-532696.
Communication dated Apr. 21, 2017 issued by the State Intellectual Property Office of People's Republic of China in counterpart application No. 201480046409.5.
Communication dated Sep. 20, 2017, issued by Korean Patent Office in counterpart application No. 10-2016-7005662.

* cited by examiner (a)

(b)

INTERNAL STRUCTURE OF COUPLING LOCK PART (c)

US 9,814,146 B2

DRIVE APPARATUS

CROSS REFERENCE TO RELATED APPLICATIONS

This application is a National Stage of International Application No. PCT/JP2014/004078 filed Aug. 5, 2014, claiming priority based on Japanese Patent Application No. 2013-173221, filed Aug. 23, 2013, the contents of which are incorporated herein by reference in their entirety.

FIELD

The present invention relates to a drive apparatus that controls and powers an electric motor.

BACKGROUND

Drive apparatuses that control and power electric motors are typically configured by combining a plurality of devices of different types, such as breakers, electromagnetic switches, inverters, and servo amplifiers. In this case, cables are connected to the devices of different types so that various signals, such as control signals and power signals, are transmitted between them. Each device is provided with terminals for connecting cables that transmit control signals and power, and signals are relayed and transmitted through cables that connect the devices.

Connecting the devices by cables is complicated and time consuming; therefore, from the perspective of reducing the number of labor-hours needed for wiring, simplification, and the like, there are configurations in which devices are connected together by connectors. The following documents in the related arts contain disclosures of configurations in which devices are connected together by connectors.

CITATION LIST

Patent Literature

Patent Literature 1: Japanese Patent Application Laid-open No. 2002-365028
Patent Literature 2: Japanese Patent Application Laid-open No. 2001-52777

SUMMARY

Technical Problem

However, the above conventional technologies are technologies for connecting devices of the same type by connectors and they do not disclose a technology for connecting devices of different types by connectors. At the present time, devices of the same type use common specifications and there are no common specifications that allow devices of different types to be connected. Thus, when devices of different types are connected, wiring operations are complicated because the positions and specifications of the terminals are different from each other. Therefore, there is a problem in that wiring is time consuming.

The present invention has been achieved in view of the above and an object of the present invention is to couple devices of different types with less time and effort and integrally install a plurality of devices.

Solution to Problem

In order to achieve the above object, a drive apparatus according to an aspect of the present invention is a drive apparatus that controls an electric motor and includes a first device and a second device, the first device having a surface on which a first connector is arranged, the second device having a surface on which a second connector, which has a same standard as the first connector, is arranged and having a function that is different from a function of the first device, wherein the surface of the first device on which the first connector is arranged and the surface of the second device on which the second connector is arranged are in close contact with each other, and the first connector of the first device is connectable to the second connector of the second device.

Advantageous Effects of Invention

According to the drive apparatus in the present invention that controls an electric motor, devices of different types can be coupled together with less time and effort.

DESCRIPTION OF EMBODIMENTS

First Embodiment

A first embodiment of the present invention reduces the time and effort that are needed to connect together devices that have different functions and from which a drive apparatus, which controls and powers an electric motor, is configured. Examples of the devices that have different functions are breakers, electromagnetic switches, inverters, and servo amplifiers; however, other devices are also applicable.

Figure 1:
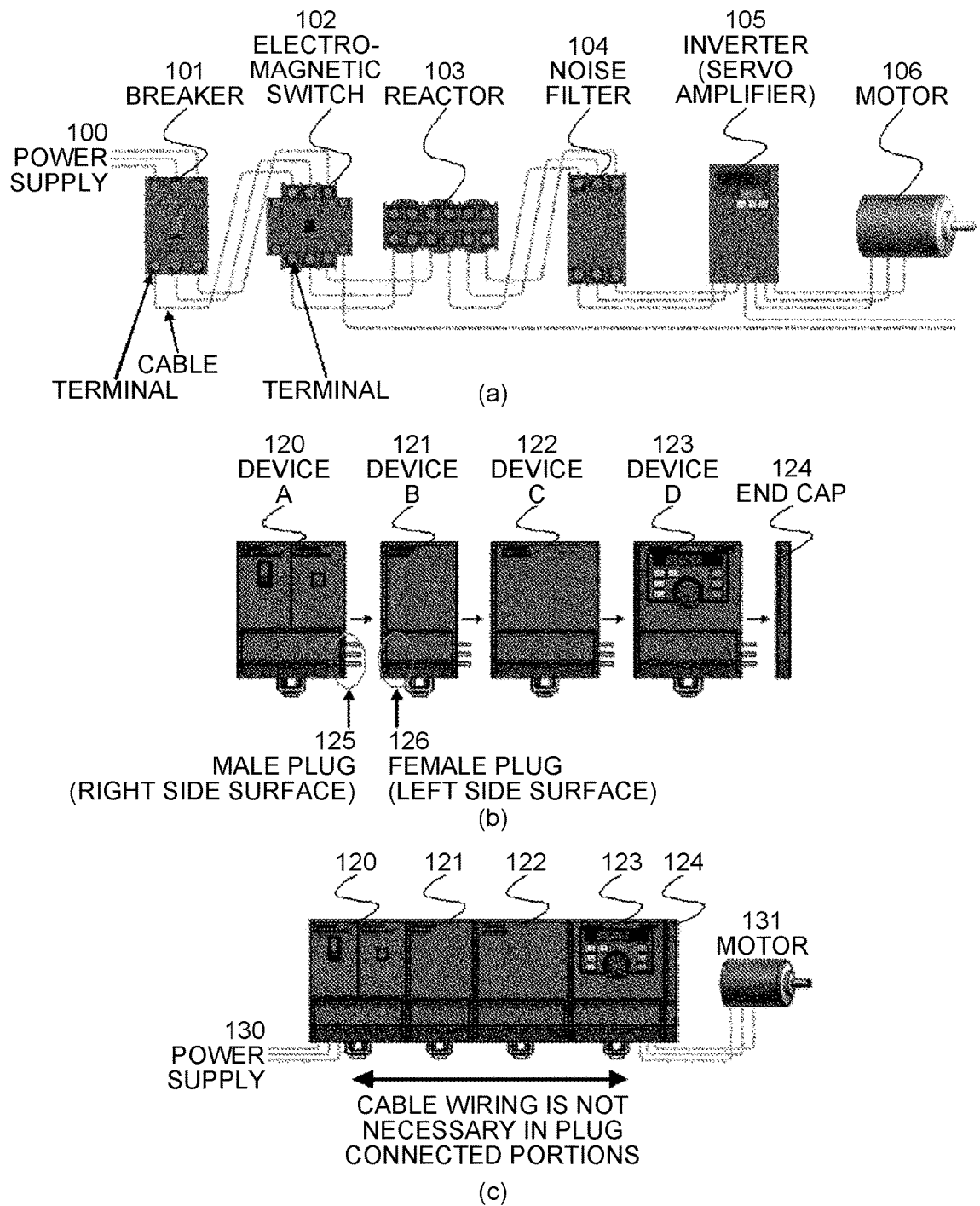
FIG. 1 is a configuration diagram of a drive apparatus that controls an electric motor according to a first embodiment of the present invention.

FIG. 1 illustrates devices from which a drive apparatus, which controls an electric motor, is configured. FIG. 1(a) illustrates configurations of devices from which a conventional drive apparatus, which controls an electric motor, is configured; FIG. 1(b) illustrates configurations of devices from which a drive apparatus according to the first embodiment of the present invention, which controls an electric motor, is configured; and FIG. 1(c) illustrates a configuration in which the devices from which the drive apparatus according to the first embodiment of the present invention, which controls the electric motor, is configured are combined. In FIG. 1, a power supply 100, a breaker 101, an electromagnetic switch 102, a reactor 103, a noise filter 104, an inverter 105, a motor 106, devices 120 to 123, from which the drive apparatus is configured, an end cap 124, male plugs 125, female plugs 126, a power supply 130, and a motor 131 are illustrated.

As illustrated in FIG. 1(a), in the conventional drive apparatus, each device, such as the breaker 101, the electromagnetic switch 102, the reactor 103, the noise filter 104, the inverter 105, and the motor (electric motor) 106, includes terminals for connecting cables, and the devices are connected by cables. In contrast, in the drive apparatus according to the first embodiment of the present invention illustrated in FIG. 1(b), the devices 120 to 123 having different functions have plugs having the same standard. In FIG. 1(b), the male plug 125 of the device 120 and the female plug 126 of the device 121 are arranged such that they can be connected together. The device 120 and the device 121 can exchange control signals via the male plug 125 and the female plug 126 that are connected together.

As illustrated in FIG. 1(c), the device 120 and the device 121 are coupled together by connecting the male plug 125 and the female plug 126 together. In a similar manner, the devices 120 to 123 are coupled together and integrated by connecting the plugs together. As a result, devices of different types can be coupled together with less time and effort and thus a plurality of devices can be integrally installed. With the conventional technologies, the position and specifications of the terminals vary depending on the type of the device; therefore, wiring is time consuming. In contrast, in the drive apparatus of the present embodiment, devices of different types can be connected together with less time and effort.

Figure 2:
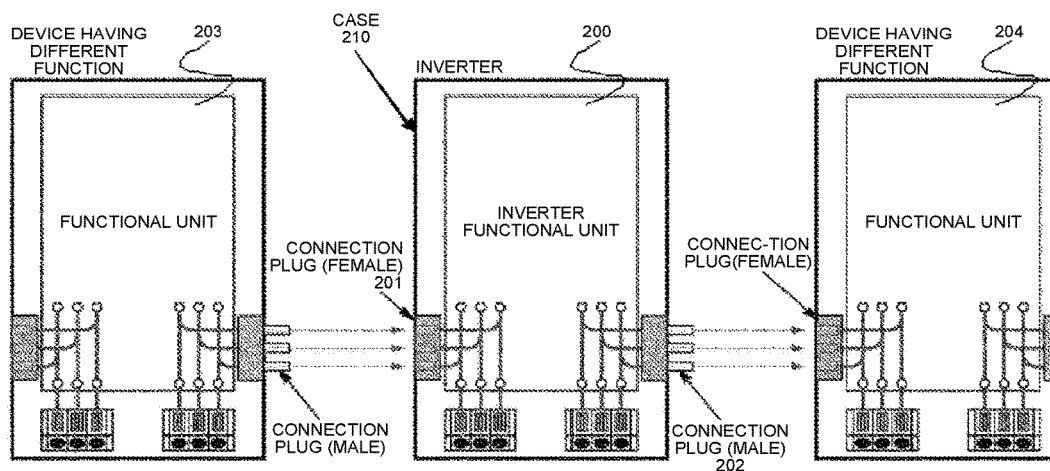
FIG. 2 illustrates a configuration of an inverter device that uses the configuration according to the first embodiment of the present invention.

FIG. 2 illustrates a configuration of an inverter device that uses the configuration according to the first embodiment of the present invention. In FIG. 2, an inverter functional unit 200 is stored in a case 210. The case 210 functions as a structure for retaining the internal components and also functions as a cover for protecting the inside thereof. Connection plugs 201 and 202 for delivery of power and the like are provided on the outside of the case 210 and the connection plugs 201 and 202 are electrically connected to the inverter functional unit 200 in the case 210. The devices 200, 203, and 204 each include the connection plugs 201 and 202, which have the same standard, at predetermined positions on the side surfaces thereof. The devices are coupled together by connecting the connection plugs together.

Figure 3:
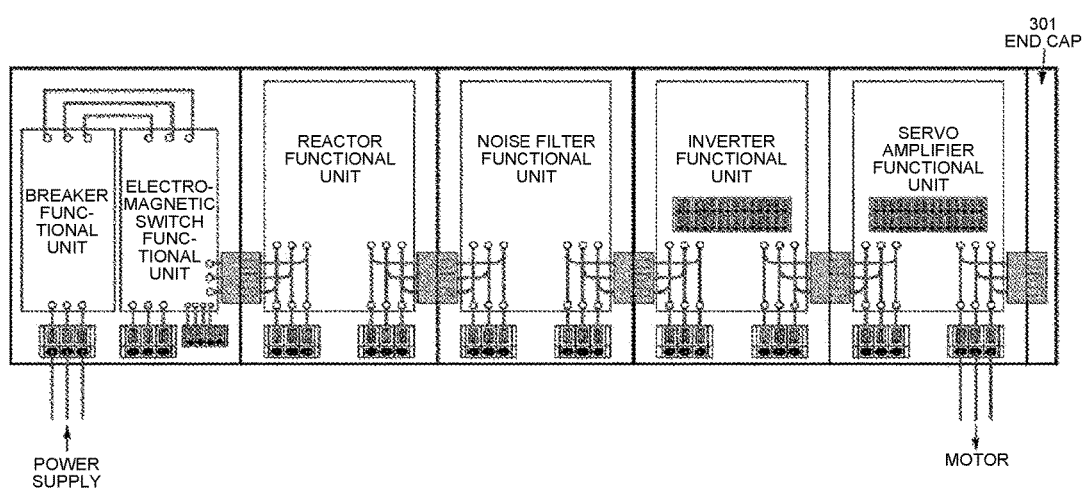
FIG. 3 is a diagram illustrating a case where various devices included in the drive apparatus according to the first embodiment of the present invention are connected together.

FIG. 3 illustrates an example of a case where various devices included in the drive apparatus according to the first embodiment of the present invention are connected together. The connection plugs of each device are arranged such that the devices can be coupled together; therefore, devices of different types can be coupled together with less time and effort. When the device is used alone or is installed at the end, an end cap 301, which is a cover for covering the exposed plug, may be provided at the end portion.

In other words, when reference is made to both FIG. 2 and FIG. 3, in the first embodiment of the present invention, a device such as an inverter device has a surface on which a plug is arranged and another device having a different function (such as a noise filtering function) has a surface on which a plug having the same standard is arranged, and the plug-equipped surface of the device such as an inverter device and the plug-equipped surface of the other device can be brought into close contact with each other. With such a configuration, devices of different types can be integrated.

Moreover, the plug of the device such as an inverter device and the plug of the other device can be connected together. With such a configuration, devices of different types can be connected together with less time and effort. Furthermore, the plug-equipped surface of the device such as an inverter device and the plug-equipped surface of the other device can have the same shape. With such a configuration, devices of different types can be integrated in a systematic fashion.

The "device such as an inverter device" may be referred to as a "first device" and the "other device" may be referred to as a "second device". Moreover, the "plug of the first device" may be referred to as a "first plug" and the "plug of the second device" may be referred to as a "second plug".

Figure 4:
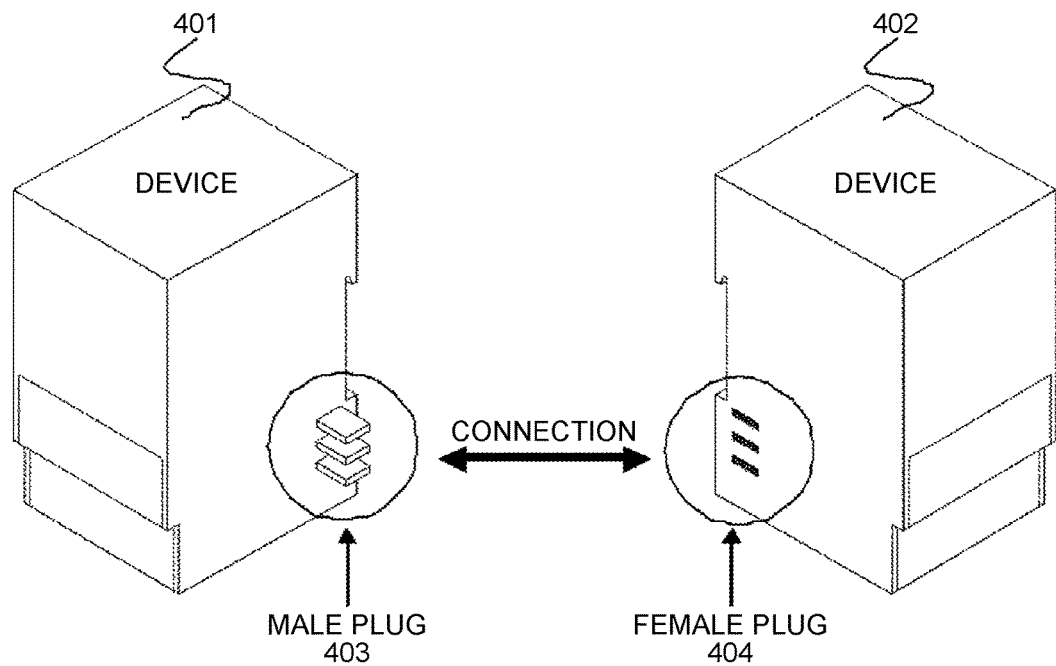
FIG. 4 illustrates a plug arrangement of devices of the drive apparatus according to the first embodiment of the present invention.

FIG. 4 illustrates images of plugs for connecting various devices of the drive apparatus according to the first embodiment of the present invention. As illustrated in FIG. 4, devices 401 and 402, which are devices of different types, include a male plug 403 and a female plug 404, respectively, i.e., the devices 401 and 402 each have a plug connection structure that enables a different device to be connected without a cable or an implement. The device 401 and 402 each have a plug connection structure according to the same standard; therefore, the connection method is simplified and thus even unskilled people can easily connect the devices. As described above, the plug of the device 401 and the plug of the device 402 each have a plug connection structure having a common standard regarding the arrangement position on the surface of the device. With such a configuration, the connection method can be simplified and thus the devices can be easily connected together.

Figure 5:
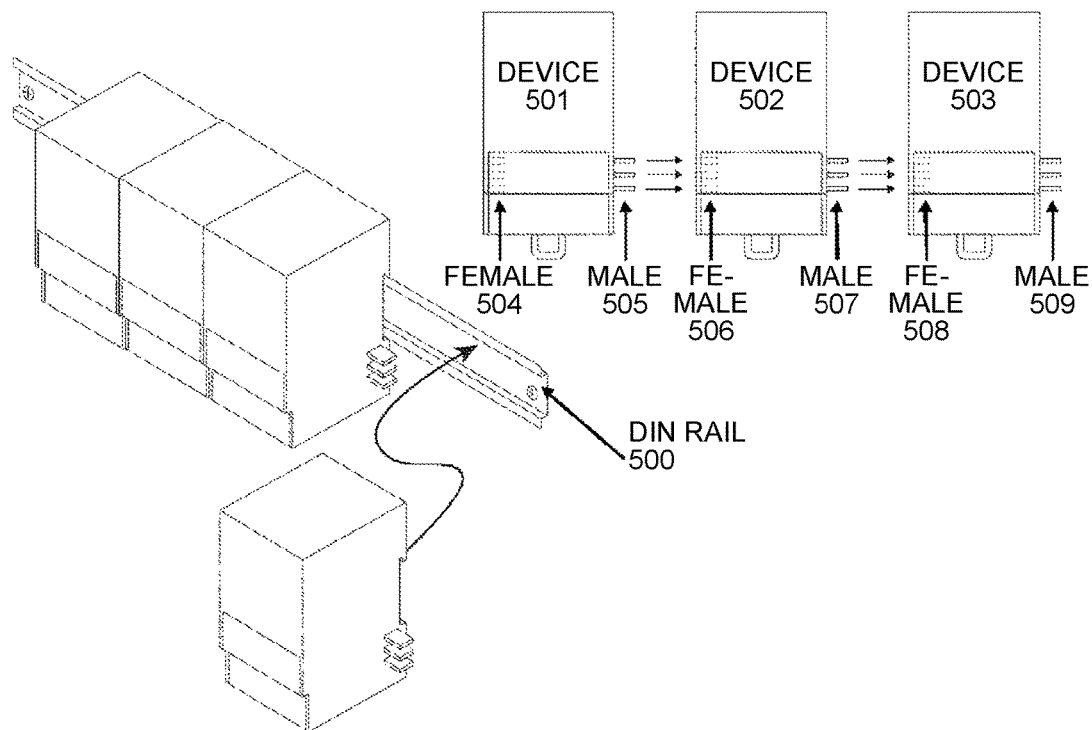
FIG. 5 is a configuration diagram in which various devices included in the drive apparatus according to the first embodiment of the present invention are arranged by using a DIN rail.

FIG. 5 illustrates an example of an arrangement of a case where various devices included in the drive apparatus are arranged side by side by using a DIN (Deutsches Institut fur Normung) rail 500. For easy coupling of the devices when they are being installed, the DIN rail 500 is used as a support fitting for fixing the devices to the panel wall surface and plug terminals are provided on the side surfaces of the devices. In this case, in order to allow a plurality of devices 501, 502, and 503, which are devices of different types, to be connected in any order, a male plug 505 and a female plug 504, a male plug 507 and a female plug 506, and a male plug 509 and a female plug 508 are arranged on the left and right side surfaces of the devices 501, 502, and 503, respectively.

Figure 6:
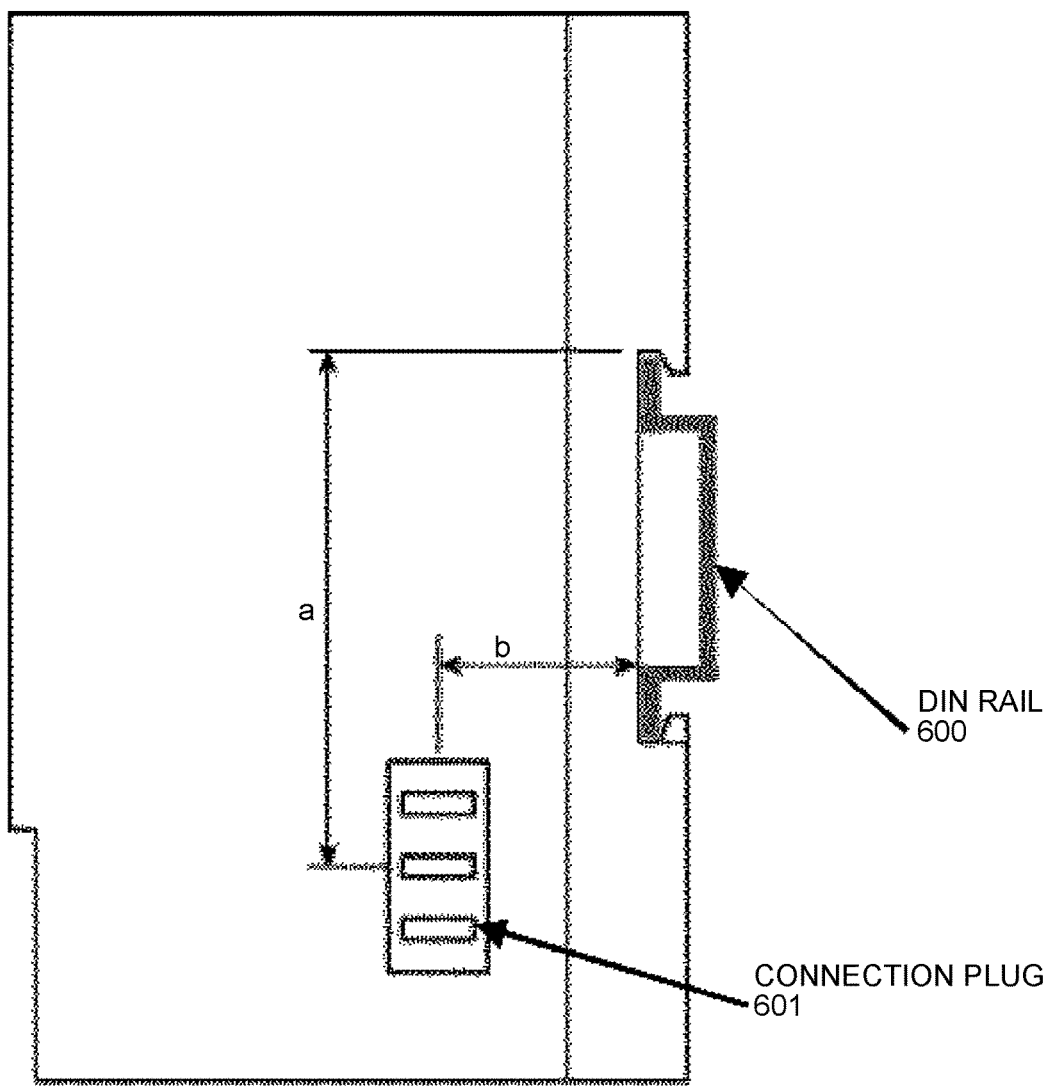
FIG. 6 is a side view of a device illustrating an arrangement of a connection plug included in the drive apparatus according to the first embodiment of the present invention.

FIG. 6 is a side view of a device included in the drive apparatus and illustrates the arrangement of a connection plug 601 arranged on the side surface of the device. In FIG. 6, the position of the connection plug 601 is set relative to a DIN rail 600. The connection plug 601 of each device is arranged such that each of the dimensions a and b relative to the DIN rail 600 is common to all the devices. Setting the position of the connection plug 601 relative to the DIN rail 600 facilitates connection of the devices without visually checking the holes in the connection plug 601.

Figure 7:
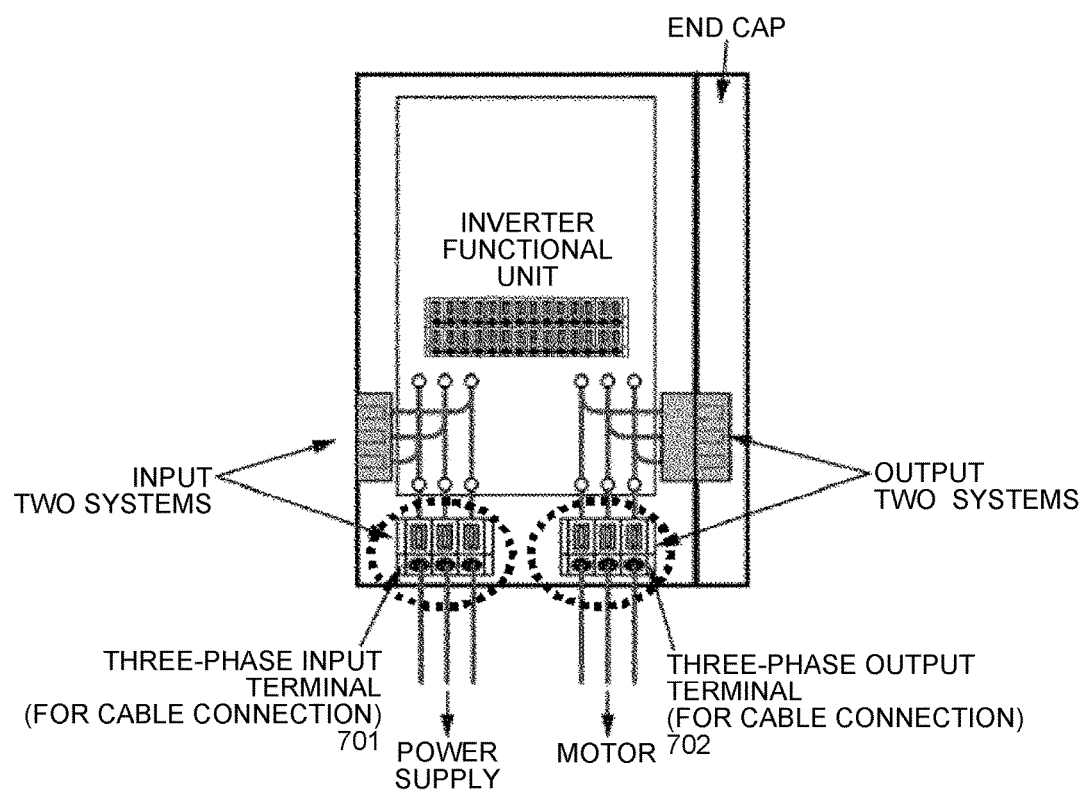
FIG. 7 illustrates a device that is included in the drive apparatus according to the first embodiment of the present invention and is adapted to a connection by both a plug and a cable.

FIG. 7 illustrates a configuration of a device that is included in the drive apparatus and can be adapted to a connection by both a connection plug and a cable. With this configuration, the device included in the drive apparatus includes an input/output terminal for cable connections in addition to connection plugs. The terminal for cable connections may be configured from a three-phase input terminal 701 and a three-phase output terminal 702 or may be configured in another way. By using such a configuration, it is possible to selectively use, depending on the type of the device to be connected, any of a plug connection and a cable connection that is a conventional technology. As a result, the device can be connected not only to a device that uses a plug connection but also to a device in the conventional technology that uses a cable connection.

Figure 8:
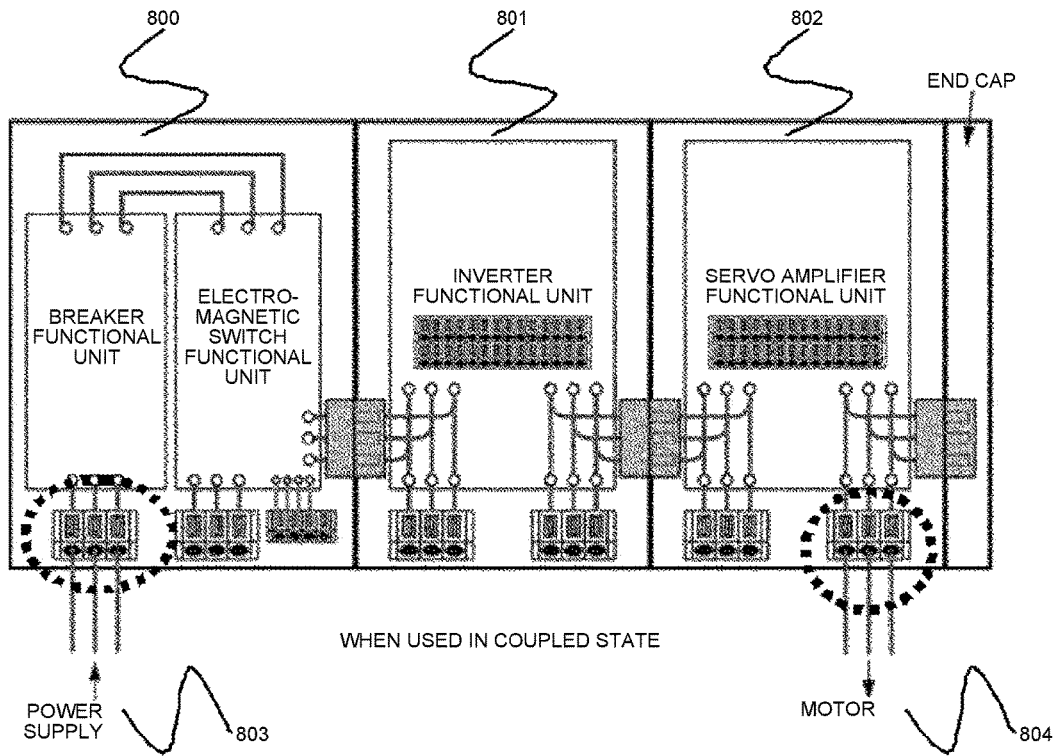
FIG. 8 is a configuration diagram of a case where devices that are adapted to a connection by both a plug and a cable are coupled together in the drive apparatus according to the first embodiment of the present invention.

FIG. 8 is a configuration diagram of a case where a plurality of devices that are adapted to both a connection by a plug and a connection by a cable are coupled together. Each device is provided with an input/output terminal for cable connections in the lower portion. The input/output terminal for cable connections is connected in parallel with a power circuit of a three-phase plug. In order to prevent the cable from overhanging the front surface of the device, a common form is used in each device with the cable connection terminal being arranged in the lower portion of the device.

In this configuration, devices 800, 801, and 802, which are devices of different types, are connected by plugs. In contrast, the device 800 is connected to a power supply 803 by a cable and the device 802 is also connected to a motor 804 by a cable. In this manner, the devices 800, 801, and 802, which can be coupled together, are connected by plugs, and the devices 800, 801, and 802 are connected to external devices, to which they are not coupled, by cables. In other words, the device 801 includes the first plug for connecting to other devices and a cable connection terminal that is adapted to a connection by a cable. Therefore, the device 801 can be connected to various types of devices that include a device that is not adapted to a connection by a plug.

Figure 9:
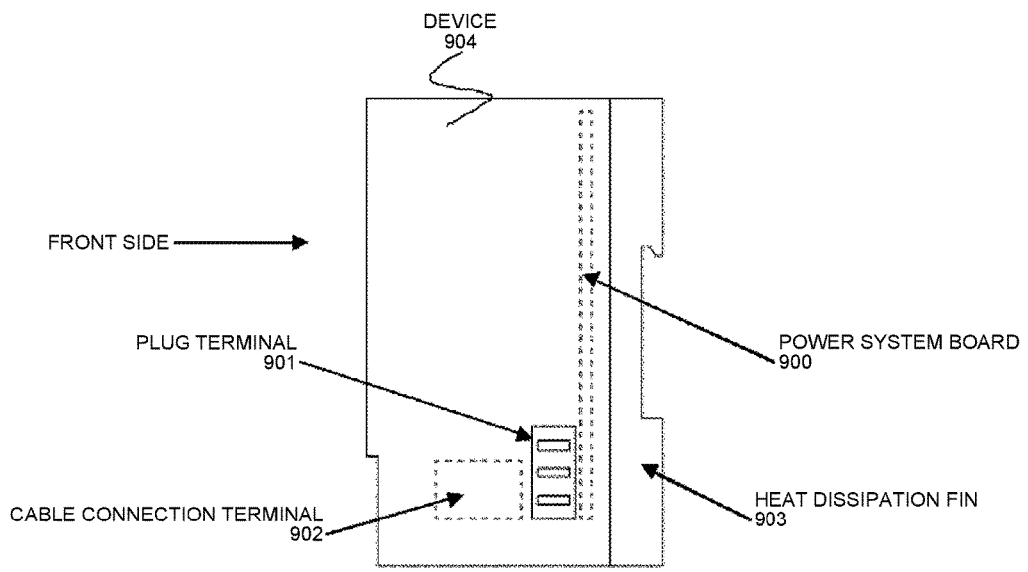
FIG. 9 is a side view of a device illustrating an arrangement of a plug terminal and a cable connection terminal included in the drive apparatus according to the first embodiment of the present invention.

FIG. 9 is a configuration diagram of a device that is adapted to a connection by both a plug and a cable. FIG. 9 illustrates a power system board 900, a plug terminal 901, a cable connection terminal 902, a heat dissipation fin 903, and a device 904. In order to arrange the plug terminal 901 and the cable connection terminal 902 on the same power system board 900 in an effective manner, the plug terminal 901 is arranged near the power system board 900. Moreover, because the power system board 900 is arranged near the heat dissipation fin 903 provided on the back surface of the device 904, the plug terminal 901 is arranged on the far side when viewed from the front side of the device 904 so that the plug terminal 901 is arranged near the power system board 900. Moreover, because the cable is routed to the lower side of the device 904, the cable connection terminal 902 is arranged in the lower portion of the device 904. Furthermore, in order to prevent the power system circuits in the device 904 from being dispersed, the plug terminal 901 is arranged near the cable connection terminal 902. In order to prevent faulty wiring, the pin assignment of the plugs is made uniform for the devices in addition to the position and shape of the plugs.

Figure 10:
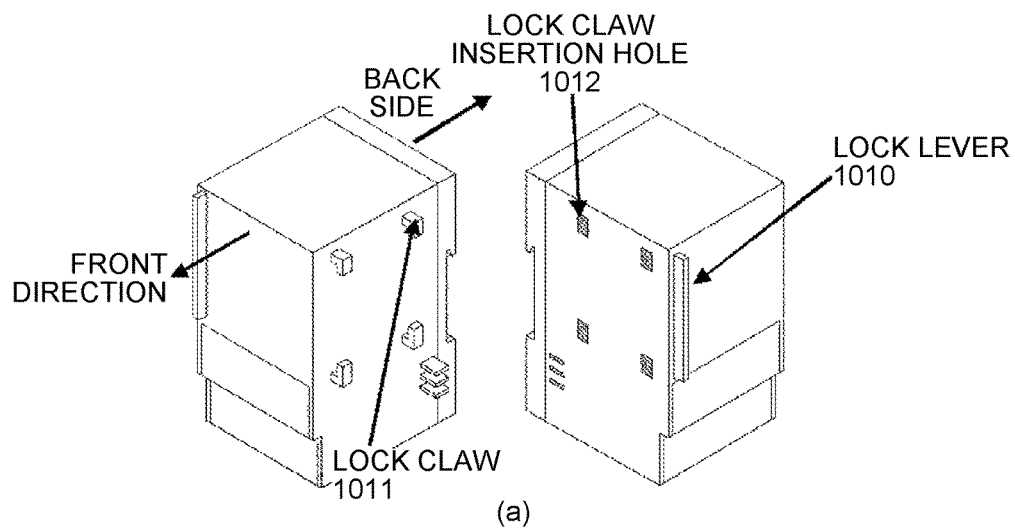
FIG. 10 illustrates a configuration of devices provided with coupling lock structures for fixing the devices included in the drive apparatus according to the first embodiment of the present invention.
Figure 10:
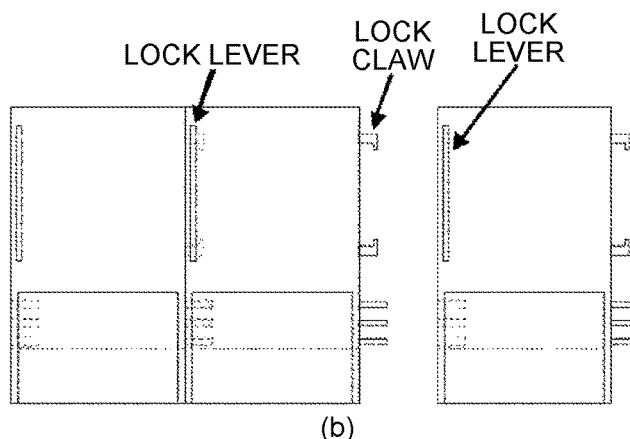
Figure 10:
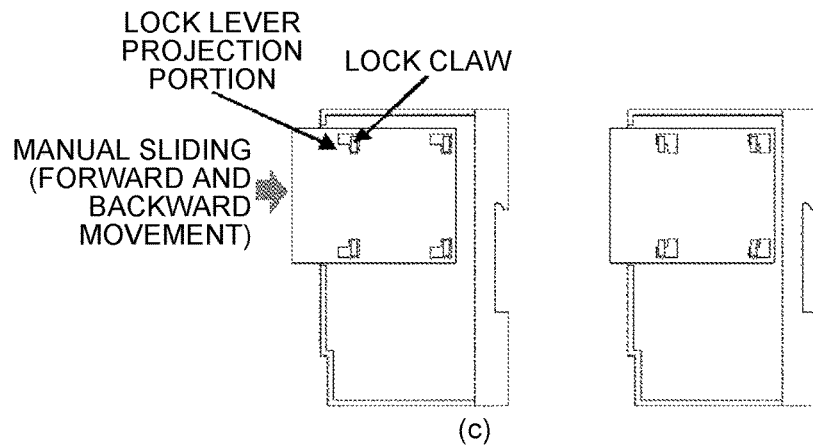

FIG. 10(*a*) illustrates a configuration of devices provided with coupling lock structures for fixing the devices so that coupled devices are not separated from each other. Each device includes a manual slide lock lever 1010, with which the devices can be fixed without an implement. As illustrated in FIG. 10(*b*), when the devices are arranged laterally side by side such that they are in contact with each other, lock claws 1011 on the side surface of the device are inserted into lock claw insertion holes 1012 formed in the adjacent device. At this point, when the lock lever 1010 is slidably moved to the back side, the lock lever projection portions overlap the lock claws; therefore, the devices form an integrated structure so that they are not separated from each other.

FIG. 10(*c*) illustrates the coupling lock structures that are arranged on the right and left side surfaces of each device and form a pair. The coupling lock structure on the male side has hooked claws, the coupling lock structure on the female side has holes into which the male-side claws can be inserted, and the hooked male claws are provided with engaging parts that engage the female holes by slidably moving the lock lever. A slide structure is provided such that the engaging parts can be manually moved to and retracted from the female hole positions and thus a sliding operation can be performed by the lever.

In other words, on the plug-equipped surface of one device and on the plug-equipped surface of another device connected to the device, lock structures are provided that enable the two devices to be coupled together. With the lock structures, a plurality of devices of different types can form an integrated structure so that they are not separated from each other. Therefore, it is possible to obtain advantages such as the highly efficient use of space and ease of carrying.

According to the configuration described above, the connection method is simplified; therefore, devices can be connected easily. As a result, devices of different types can be coupled together with less time and effort. In the present embodiment, devices are connected by plugs; however, devices may be connected by using connectors instead of plugs. Moreover, the "drive apparatus that controls the electric motor" in the present embodiment can be more generally considered to be a "drive apparatus that supplies power".

REFERENCE SIGNS LIST

100: power supply,
101: breaker,
102: electromagnetic switch,
103: reactor,
104: noise filter,
105: inverter,
106: motor,
120 to 123: devices from which a drive apparatus is configured,
124: end cap,
125: male plug,
126: female plug,
130: power supply,
131: motor,
200: inverter functional unit,
201, 202: connection plugs,
203, 204: devices having a different function,
210: case,
301: end cap,
401, 402: devices,
403: male plug,
404: female plug,
500: DIN rail,
501, 502, 503: devices,
504, 506, 508: female plugs,
505, 507, 509: male plugs,
600: DIN rail, 601: connection plug,
701: three-phase input terminal,
702: three-phase output terminal,
800, 801, 802: devices,
803: power supply,
804: motor,
900: power system board,
901: plug terminal,
902: cable connection terminal,
903: heat dissipation fin,
904: device,
1010: lock lever,
1011: lock claw,
1012: lock claw insertion hole.

The invention claimed is:

1. A drive apparatus that controls an electric motor comprising:
   a plurality of devices, wherein each one of the plurality of devices comprises:
   a first surface on which a first connector is arranged; and
   a second surface on which a second connector is arranged,
   wherein the first connector and the second connector have the same standard with each other,
   wherein said each one of the plurality of devices has a different function from each other,
   wherein the first connector of said one of the plurality of devices as a first device is connectable to the second connector of another one of the plurality of devices as a second device arranged adjacent to the first device, and
   an arrangement position of the first connector on the first surface of the first device and an arrangement position of the second connector on the second surface of the second device correspond to each other.

2. The drive apparatus according to claim 1, wherein the first surface of the first device on which the first connector is arranged and the second surface of the second device on which the second connector is arranged are in close contact with each other.

3. The drive apparatus according to claim 1, wherein the first connector and the second connector of said each one of the plurality of devices are arranged such that the plurality of devices are coupled together.

4. The drive apparatus according to claim 1, wherein the first connector is a male plug and the second connector is a female plug.

5. The drive apparatus according to claim 1, further comprising:
   an end cap as a cover for covering an exposed connector when one of the plurality of devices is used alone or is installed at an end.

6. The drive apparatus according to claim 1, wherein the plurality of devices exchange control signals via the first connector and the second connector.

7. The drive apparatus according to claim 1, wherein the plurality of devices are connected in an arbitrary order.

8. A drive apparatus that controls an electric motor comprising:
   a plurality of devices, wherein each one of the plurality of devices comprises:
   a first surface on which a first connector is arranged; and
   a second surface on which a second connector is arranged,
   wherein:
   the first connector and the second connector have the same standard with each other,
   said each one of the plurality of devices has a different function from each other,
   the first connector of said one of the plurality of devices as a first device is connectable to the second connector of another one of the plurality of devices as a second device arranged adjacent to the first device, and
   said each one of the plurality of devices includes a cable connection terminal adapted to a connection with said another one of the plurality of devices by a cable.

9. The drive apparatus according to claim 8, wherein the first connector and the cable connection terminal are arranged on a same substrate.

10. The drive apparatus according to claim 8, wherein
    the first device is a device that includes a servo amplifier functional unit,
    the second device is a device that includes an inverter functional unit, and
    the first device and the second device are connected by the first connector and the second connector, and the first device is connected to a motor by the cable connection terminal.

11. A drive apparatus that controls an electric motor comprising:
    a plurality of devices, wherein each one of the plurality of devices comprises:
    a first surface on which a first connector is arranged; and
    a second surface on which a second connector is arranged,
    wherein:
    the first connector and the second connector have the same standard with each other,
    said each one of the plurality of devices has a different function from each other,
    the first connector of said one of the plurality of devices as a first device is connectable to the second connector of another one of the plurality of devices as a second device arranged adjacent to the first device, and
    the first surface of the first device on which the first connector is arranged and the second surface of the second device on which the second connector is arranged have a lock structure with which the first device is capable of being coupled to the second device.

12. The drive apparatus according to claim 11, wherein the plurality of devices of different types can form an integrated structure so that they are not separated from each other.

* * * * *